(12) United States Patent  
Jeong et al.

(10) Patent No.: US 9,076,984 B2  
(45) Date of Patent: Jul. 7, 2015

(54) MOTHER PANEL FOR DISPLAY PANEL AND METHOD OF MANUFACTURING DISPLAY PANEL USING THE MOTHER PANEL

(71) Applicant: Samsung Display Co., Ltd., Gyeonggi-do (KR)

(72) Inventors: Beung-Hwa Jeong, Yongin (KR); Hyun-Soo Choi, Yongin (KR); Jin-Hyun Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/017,736

(22) Filed: Sep. 4, 2013

(65) Prior Publication Data

US 2014/0167004 A1    Jun. 19, 2014

(30) Foreign Application Priority Data

Dec. 13, 2012  (KR) .................. 10-2012-0145709

(51) Int. Cl.
*H01L 51/00*     (2006.01)
*H01L 51/52*     (2006.01)
*H01L 27/32*     (2006.01)

(52) U.S. Cl.
CPC ......... *H01L 51/5246* (2013.01); *H01L 27/3241* (2013.01)

(58) Field of Classification Search
CPC . H01L 51/0017; H01L 51/5246; H01L 51/56; H01L 51/5237; H01L 27/12; H01L 27/1214; H01L 27/3241
USPC ............................... 257/40, 59, 72
See application file for complete search history.

(56) References Cited

U.S. PATENT DOCUMENTS

| | | | | |
|---|---|---|---|---|
| 6,970,227 B2* | 11/2005 | Kida et al. | ..................... | 349/190 |
| 7,359,021 B2* | 4/2008 | Ota et al. | ..................... | 349/137 |
| 7,944,542 B2* | 5/2011 | Woo et al. | ..................... | 349/187 |
| 8,038,495 B2* | 10/2011 | Lee et al. | ..................... | 445/23 |
| 8,233,129 B2* | 7/2012 | Sasaki et al. | ................... | 349/154 |
| 8,319,418 B2 | 11/2012 | Lee et al. | | |
| 8,673,751 B2* | 3/2014 | Oh et al. | ..................... | 438/489 |
| 2004/0141141 A1* | 7/2004 | Ota et al. | ..................... | 349/153 |
| 2007/0211204 A1* | 9/2007 | Woo et al. | ..................... | 349/158 |
| 2012/0107984 A1* | 5/2012 | Oh et al. | ..................... | 438/34 |

FOREIGN PATENT DOCUMENTS

KR   10-2010-0128752         12/2010
KR   10-2011-0025288 A        3/2011
KR   10-2012-0005294 A        1/2012

* cited by examiner

*Primary Examiner* — Nikolay Yushin
(74) *Attorney, Agent, or Firm* — Lee & Morse, P.C.

(57) ABSTRACT

A mother panel for a display panel includes a first mother substrate and a second mother substrate that are spaced apart from each other to face each other, each of which includes at least one usable area that is usable as the display panel, and at least one unusable area that surrounds the usable area. The mother panel also includes a plurality of display panel patterns between the first mother substrate and the second mother substrate that are spaced apart from one another in the usable area, a seal pattern that adheres the first mother substrate with the second mother substrate and seals each of the plurality of display panel patterns, and an etching stopping unit that prevents an etchant from permeating between the first mother substrate and the second mother substrate and prevents a boundary area of an etching target surface from being etched.

20 Claims, 13 Drawing Sheets

MOTHER PANEL FOR DISPLAY PANEL AND METHOD OF MANUFACTURING DISPLAY PANEL USING THE MOTHER PANEL

CROSS-REFERENCE TO RELATED APPLICATION

This application claims the benefit of Korean Patent Application No. 10-2012-0145709 filed on Dec. 13, 2012, in the Korean Intellectual Property Office, and entitled: "MOTHER PANEL FOR DISPLAY PANEL AND METHOD OF MANUFACTURING DISPLAY PANEL USING THE MOTHER PANEL," the disclosure of which is incorporated by reference herein in its entirety.

BACKGROUND

Embodiments relate to a mother panel for a display panel and a method of manufacturing a display panel using the mother panel.

SUMMARY

According to an embodiment, there is provided a mother panel for a display panel, the mother panel including a first mother substrate and a second mother substrate which are disposed spaced apart from each other to face each other, and in each of which at least one of usable area that is usable as the display panel and at least one of unusable area that surrounds the usable area are defined, a plurality of display panel patterns which are disposed between the first mother substrate and the second mother substrate and are arranged spaced apart from one another in the usable area, a seal pattern for adhering the first mother substrate with the second mother substrate and sealing each of the plurality of display panel patterns, and an etching stopping unit for preventing an etchant from permeating between the first mother substrate and the second mother substrate and preventing a boundary area of an etching target surface of at least one of the first mother substrate and the second mother substrate from being etched.

The seal pattern may include a sealing member disposed to surround each of the plurality of display panel patterns and a dummy sealing member disposed in the unusable area to increase an adhesive strength between the first mother substrate and the second mother substrate.

The etching stopping unit may include a first etching stopping member for making a seal between the first mother substrate and the second mother substrate and a second etching stopping member formed to extend from a lateral surface of at least one of the first mother substrate and the second mother substrate to the boundary area of the etching target surface of the at least one of the first mother substrate and the second mother substrate.

A front of the second etching stopping member may be located closer to an extending line of an end portion of the mother substrate than to a center of the dummy sealing member.

A length of at least one of the first mother substrate and the second mother substrate may be about 730 mm to about 1500 mm.

The number of usable areas may be single or plural.

The plurality of usable areas may be disposed spaced apart from each other, and the mother panel may further include a second etching stopping unit formed between the plurality of usable areas on the etching target surface of at least one of the first mother substrate and the second mother substrate.

A width of the second etching stopping unit may be about 2 mm to about 15 mm.

A length of at least one of the first mother substrate and the second mother substrate may be about 1500 mm to about 2500 mm.

The etching stopping unit and the second etching stopping unit may be formed of an epoxy-based resin.

In at least one of the first mother substrate and the second mother substrate, the thickness of the unusable area may be larger than the thickness of the usable area.

The usable area of at least one of the first mother substrate and the second mother substrate may have a thickness of about 0.2 mm or less.

Each of the plurality of display panel patterns may include a first electrode, a second electrode, and an intermediate layer which is disposed between the first electrode and the second electrode and includes an organic emission layer.

Each of the plurality of display panel patterns may further include a thin film transistor which is electrically connected with the first electrode and which includes an active layer, a gate electrode, a source electrode, and a drain electrode.

According to another embodiment, there is provided a method of manufacturing a display panel, the method including providing a mother panel for the display panel, the mother panel including a first mother substrate and a second mother substrate which are disposed spaced apart from each other to face each other and in each of which at least one of usable area that is usable as the display panel and at least one of unusable area that surrounds the usable area are defined, a plurality of display panel patterns which are disposed between the first mother substrate and the second mother substrate and are arranged spaced apart from one another in the usable area, and a seal pattern for adhering the first mother substrate with the second mother substrate and sealing each of the plurality of display panel patterns; forming an etching stopping unit between the first mother substrate and the second mother substrate and from a lateral surface of at least one of the first mother substrate and the second mother substrate to the boundary area of the etching target surface of the at least one of the first mother substrate and the second mother substrate; etching the etching target surface of the at least one of the first mother substrate and the second mother substrate; and cutting the first mother substrate and the second mother substrate according to the plurality of display panel patterns.

In the mother substrate that is etched in the etching, the thickness of an area which overlaps with the etching stopping unit may be larger than the thickness of the usable area.

The forming of the etching stopping unit may include forming a second etching stopping unit between the plurality of usable areas on the etching target surface of the at least one of the first mother substrate and the second mother substrate, if the number of usable areas is plural.

The cutting may use a laser cutting scheme.

A minimum thickness of the usable area of at least one of the first mother substrate and the second mother substrate may be about 0.2 mm or less.

Each of the plurality of display panel patterns may include a first electrode, a second electrode, and an intermediate layer which is disposed between the first electrode and the second electrode and includes an organic emission layer.

Each of the plurality of display panel patterns may further include a thin film transistor which is electrically connected with the first electrode and which includes an active layer, a gate electrode, a source electrode, and a drain electrode.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
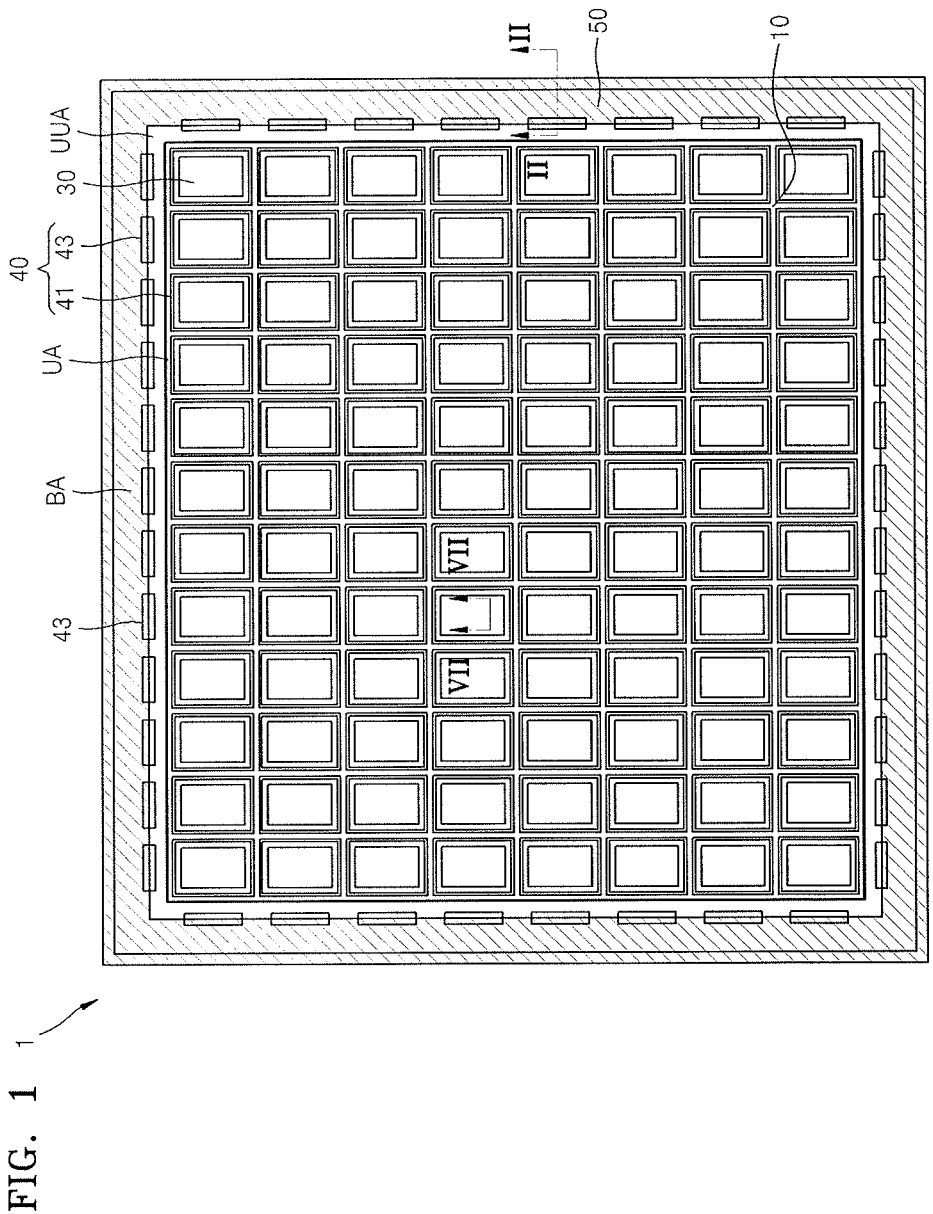
FIG. 1 is a plan view schematically illustrating a structure of a mother panel according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
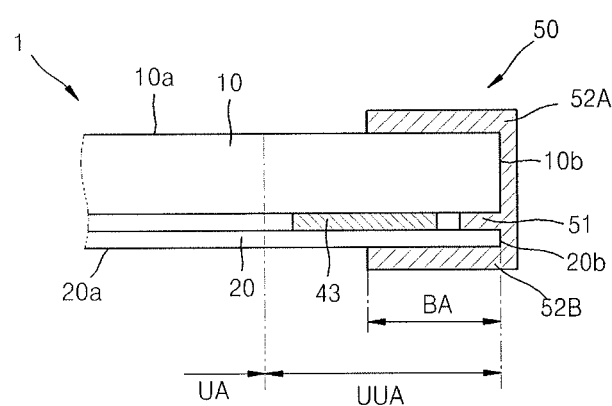
FIG. 2 schematically illustrates a cross-section cut along a line II-II of FIG. 1 according to an embodiment.

FIG. 1 is a plan view schematically illustrating a structure of a mother panel according to an embodiment. FIG. 2 schematically illustrates a cross-section cut along a line II-II of FIG. 1 according to an embodiment. Referring to FIGS. 1 and 2, a mother panel 1 may include a first mother substrate 10 and a second mother substrate 20 which are disposed spaced apart from each other to face each other, display panel patterns 30 and a seal pattern 40 which is disposed between the first mother substrate 10 and the second mother substrate 20, and an etching stopping unit 50.

The first mother substrate 10 or the second mother substrate 20 may be formed of a transparent glass material having $SiO_2$ as a main component. The first mother substrate 10 or the second mother substrate 20 is not limited to the transparent glass material and may also be formed of a transparent plastic material. The first mother substrate 10 may be a substrate in which a plurality of display panel patterns 30 are formed, and the second mother substrate 20 may be an encapsulating substrate for protecting the display panel patterns 30 from external moisture, air, and the like.

Each of the first mother substrate 10 and the second mother substrate 20 may be divided into a usable area UA which is usable as a complete display panel (i.e., in a completed display panel) and an unusable area UUA which surrounds the usable area UA. In the unusable area UUA may be disposed components which are not used in a final product, but are necessary for manufacturing, for example, a dummy sealing member 43 and the etching stopping unit 50 which will be described below. The unusable area UUA may include a boundary area BA of each of the first mother substrate 10 and the second mother substrate 20.

Although the first mother substrate 10 and the second mother substrate 20 are illustrated as having the same size, but they are not limited to the illustration. For example, the size of the first mother substrate 10 may be larger than or smaller than that of the second mother substrate 20. In this case, the size of the unusable area UUA of the first mother substrate 10 may be different from the size of the second mother substrate 20.

The first mother substrate 10 or the second mother substrate 20 may have a size which is several times to several hundred times (e.g., about 3 to about 300 times) the size of a complete display panel. For example, the first mother substrate 10 or the second mother substrate 20 may have a size of about 730×460 to about 1300×1500 mm². As another example, for productivity improvement, the size of the first mother substrate 10 or the second mother substrate 20 may not exceed about 1300×1500 mm². The length of a side of the first mother substrate 10 or the second mother substrate 20 may be about 730 to about 1500 mm or may be about 1500 to about 2500 mm.

The display panel patterns 30 are disposed between the first mother substrate 10 and the second mother substrate 20. The plurality of display panel patterns 30 may be arranged spaced apart from each other in the usable area UA. The display panel patterns 30 may include light emitting elements 330 (see FIG. 7) for light emission and thin film transistors (TFT) 320 (see FIG. 7) for driving the light emitting elements 330, and detailed structures thereof will be described later with reference to FIG. 7.

The seal pattern 40 may seal the plurality of display panel patterns 30 to prevent the plurality of display panel patterns 30 disposed between the first mother substrate 10 and the second mother substrate 20 from being affected by external moisture or air, and may adhere the first mother substrate 10 and the second mother substrate 20 to each other.

The seal pattern 40 may include a sealing member 41 and the dummy sealing member 43. The sealing member 41 is disposed to surround the plurality of display panel patterns 30 in the usable area UA, respectively. The dummy sealing member 43 is disposed in the unusable area UUA between the first mother substrate 10 and the second mother substrate 20 to increase an adhesive strength between the first mother substrate 10 and the second mother substrate 20. The dummy sealing member 43 is disposed in the unusable area UUA, such that it may be removed during manufacturing of a display panel to not be included in the complete display panel. The seal pattern 40 may include frit or curable resin as its material. For example, the sealing member 41 may include frit and the dummy sealing member 43 may include epoxy-based resin which is a type of curable resin. Examples of epoxy-based rein may include cycloaliphatic epoxide, epoxy acrylate, vinyl epoxy-based resin, and the like.

The etching stopping unit 50 prevents an etchant from permeating between the first mother substrate 10 and the second mother substrate 20 when etching is performed on at least one of the first mother substrate 10 and the second mother substrate 20. The etching stopping unit 50 prevents the boundary area BA of etching target surfaces 10a and 20a of the first and second mother substrates 10 and 20 which are etching targets. Herein, the etching target surfaces 10a and 20a may be surfaces, at least a portion thereof is exposed to the etchant, and they may be surfaces which are opposite to facing surfaces of the first mother substrate 10 and the second mother substrate 20.

Figure 3:
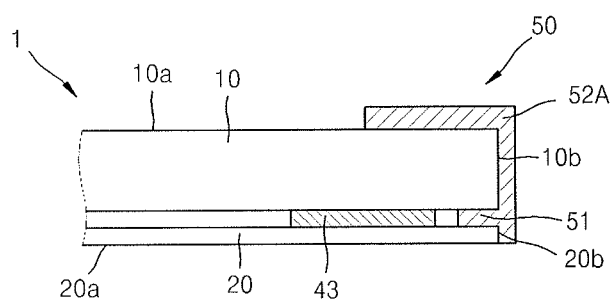
FIG. 3 schematically illustrates a cross-section cut along a line II-II of FIG. 1 according to another embodiment.

As such, to prevent the etchant from permeating between the first mother substrate 10 and the second mother substrate 20 and etching the boundary area BA of the etching target surfaces 10a and 20a, the etching stopping unit 50 may include a first etching stopping member 51 and second etching stopping members 52A and 52B. The first etching stopping member 51 is formed to make sealing between the first mother substrate 10 and the second mother substrate 20 which are spaced apart from each other. By using the first etching stopping member 51, the etchant may be prevented from permeating between the first mother substrate 10 and the second mother substrate 20. The second etching stopping members 52A and 52B extend from lateral surfaces 10b and 20b of at least one of the first mother substrate 10 and the second mother substrate 20 to the boundary area BA of the etching target surfaces 10a and 20a, thereby preventing the lateral surfaces 10b and 20b of at least one of the first and second mother substrates 10 and 20 and the boundary area BA of the etching target surfaces 10a and 20a from being etched. For example, the second etching stopping members 52A and 52B may include the second etching stopping member 52A which is formed from the lateral surface 10b of the first mother substrate 10 to the top surface (10a) boundary of the first mother substrate 10 and the second etching stopping member 52B which is formed from the lateral surface 20b of the second mother substrate 20 to the boundary of the bottom surface (20a) boundary of the second mother substrate 20 (as illustrated in FIG. 2). However, the shapes of the second etching stopping members 52A and 52B are not limited to the illustration, and the second etching stopping member 52A may be formed from the lateral surface 10b of the first mother substrate 10 to the BA of the etching target surface 10a of the first mother substrate 10. In this case, the second etching stopping member 52A may not be formed from the lateral surface 20b of the second mother substrate 20 to the boundary area BA of the etching target surface 20a (as illustrated in FIG. 3).

The etchant may be sprayed toward the first mother substrate 10, which is one of the first mother substrate 10 and the second mother substrate 20, but it may also be sprayed toward both the first mother substrate 10 and the second mother substrate 20 when necessary. For convenience' sake, the following description will be made on the assumption that the etchant is sprayed to the top surface of the first mother substrate 10.

Figure 4:
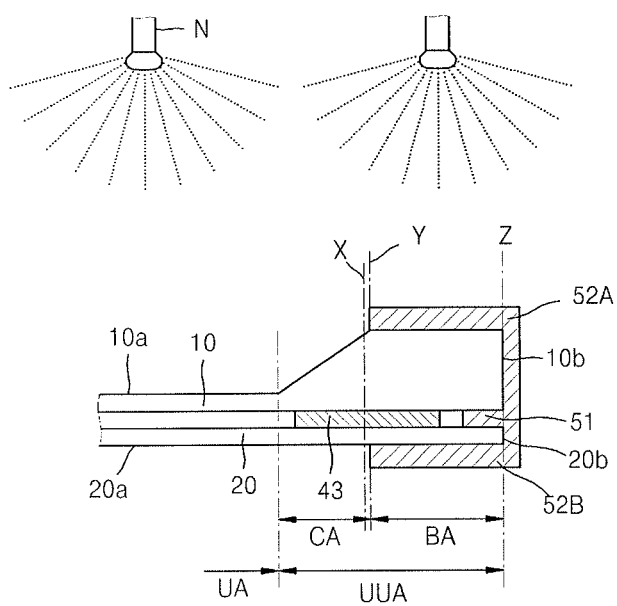
FIG. 4 illustrates a state in which etching is performed on a mother panel illustrated in FIG. 2 for a predetermined time.

FIG. 4 is a diagram illustrating a state in which etching is performed on a mother panel illustrated in FIG. 2 for a predetermined time. Referring to FIG. 4, when the etchant is sprayed to the top surface of the first mother substrate 10 by a spray nozzle, etching is performed on the etching target surface 10a (the top surface in FIG. 4) of the first mother substrate 10. On the etching target surface 10a of the first mother substrate 10, etching does not occur in an area which overlaps with the second etching stopping member 52A, and etching occurs in an area which does not overlap with the second etching stopping member 52A. Thus, in the first mother substrate 10, the thickness of the unusable area UAA may be larger than that of the usable area UA. In particular, the boundary area BA in the unusable area UUA may be thick. For example, the thickness of the usable area UA may be less than about 0.2 mm and the thickness of the boundary area BA may be about 0.5 mm. In this way, the thickness of the usable area UA is minimized and at the same time, the thickness of the boundary area BA in the unusable area UUA is larger than a predetermined thickness, such that a crack in the boundary area BA of the mother panel 1 may be prevented from being generated in a process of transferring the mother panel 1 or other manufacturing processes after etching.

Figure 5:
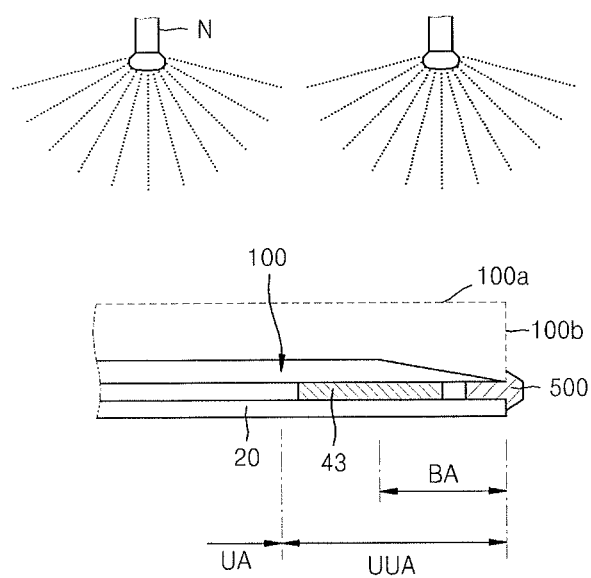
FIG. 5 illustrates a comparative example in which an etching stopping unit is not formed in a boundary area.
Figure 6:
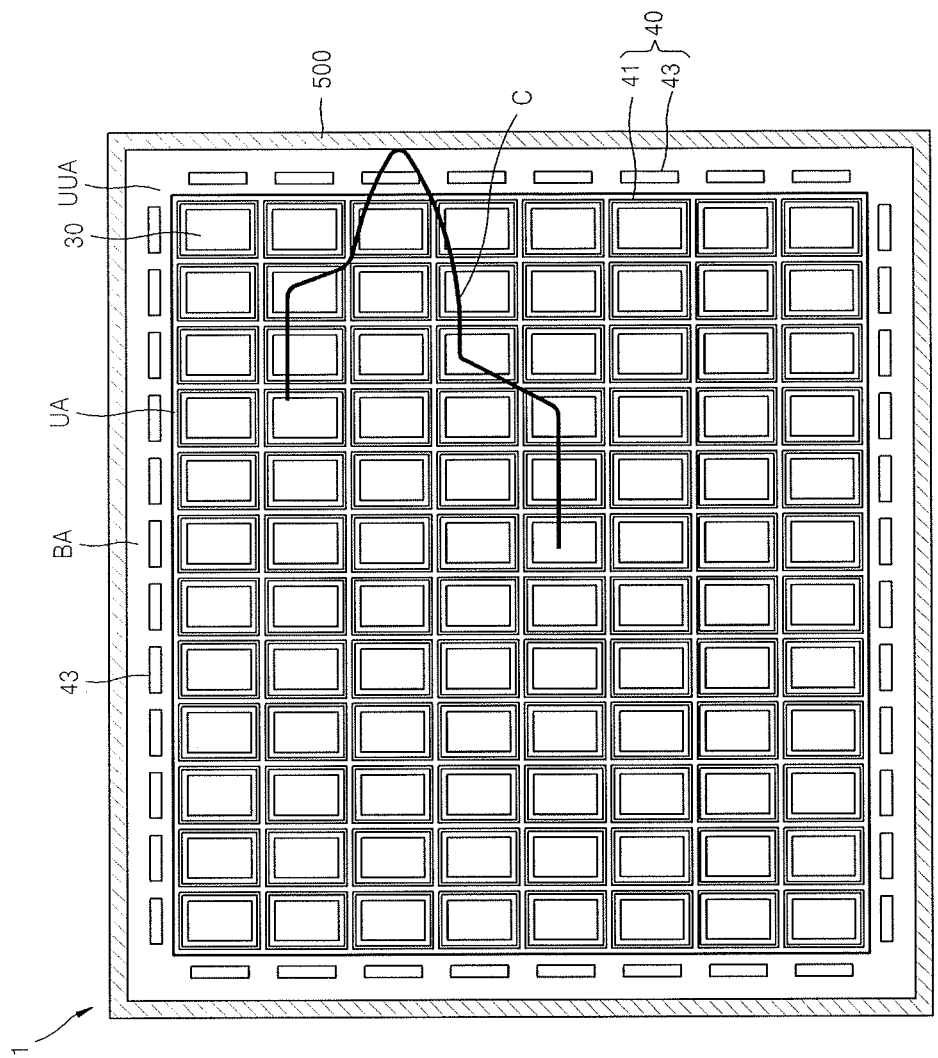
FIG. 6 illustrates a plan view of a mother panel including an etching stopping unit of FIG. 5.

FIG. 5 illustrates a comparative example in which an etching stopping unit is not formed in the boundary area BA (unlike in FIG. 4), and FIG. 6 is a plan view illustrating a mother panel including the etching stopping unit illustrated in FIG. 5. Like in FIG. 5, when the etching stopping unit 50 is not formed in the boundary area BA of the etching target surface 100a, the top surface (100a) and the lateral surface 100b, that is, two surfaces in the boundary area BA of the first mother substrate 100 are exposed to the etchant, such that an etching speed in the boundary area BA of the etching target surface 100a is higher than that in the usable area UA and thus the thickness of the boundary area BA is smaller than that of the usable area UA. As such, the first mother substrate 100 in which the boundary area BA has a smaller thickness is likely to have a crack even by a small external shock. For example, although not illustrated in the drawings, in a process of holding the boundary area BA to transfer the mother panel, a crack C may be generated in the boundary area BA and may extend as illustrated in FIG. 6.

However, by extending the etching stopping unit 50 to the boundary area BA as illustrated in FIG. 4, the boundary area BA of the lateral surface 10b and the top surface 10a of the first mother substrate 10 is prevented from being etched, such that the thickness of the boundary area BA may be relatively large and thus generation of a crack in the boundary area BA may be prevented.

A front Y of the second etching stopping member 52A (i.e., the edge facing the etching target surface 10a) may be located between an extending line Z of an end portion of the first mother substrate 10 (i.e., a line extending parallel to the lateral surface 10b of the first mother substrate 10) and a center X of the dummy sealing member 43 (i.e., a center X of the dummy sealing member 43 along the same direction that the etching stopping member 52A extends over the boundary area BA). For example, the front Y of the second etching stopping member 52A may be closer to (or farther from) the extending line Z of the end portion of the first mother substrate 10 than the center X of the dummy sealing member 43. Because etching does not occur in an area which overlaps with the second etching stopping member 52A, and etching occurs in an area which does not overlap with the second etching stopping member 52A, a portion in which a thickness decrease toward the usable area UA exists between the usable area UA and a portion in which the second etch preventing members 52A and 52B overlap. The thickness-decreasing portion, that is, a change area CA, is difficult to use as a complete display panel. Thus, by disposing the second etching stopping member 52A outside the center X of the dummy sealing member 43, the change area CA may be formed in the unusable area UUA.

The etching stopping unit 50 may be formed of a material which is not etched by the etchant, such as epoxy based resin.

When an etchant including hydrogen fluoride (HF) used for etching of the glass material is used as the etchant for the first and second mother substrates 10 and 20, epoxy based resin may be suitable as an etching stopping material. Examples of the epoxy based resin may include cycloaliphatic epoxide, epoxy acrylate, vinyl epoxy-based resin, and the like. However, the material of the etching stopping unit 50 is not limited to those examples, and any material may be used as long as it is intended to be prevented from being etched by HF.

Figure 7:
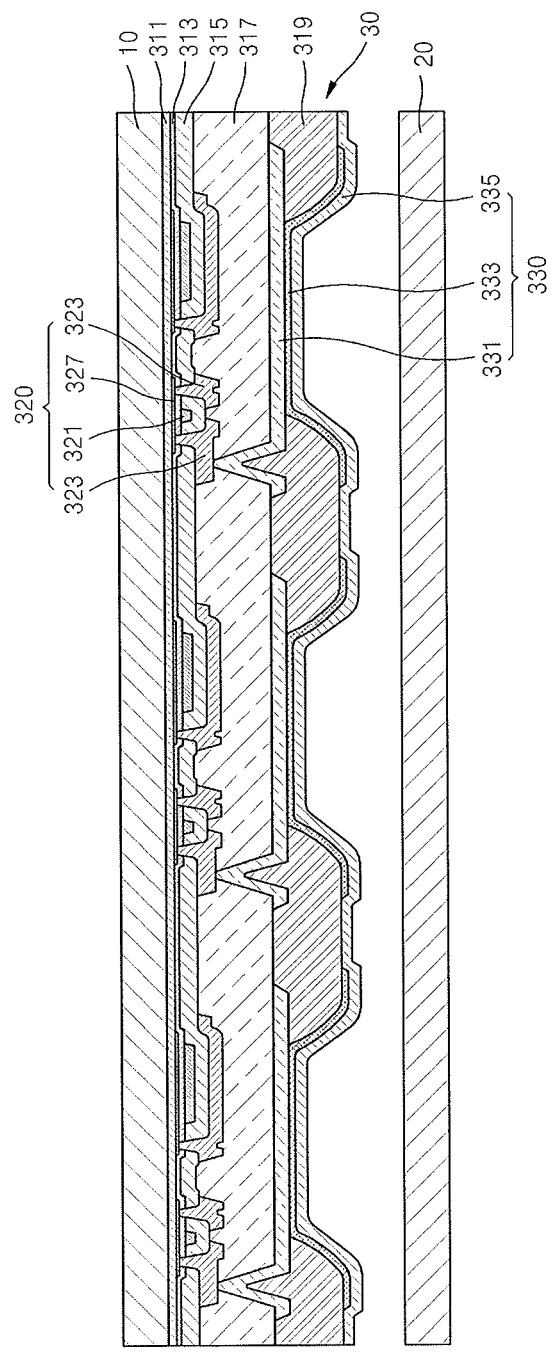
FIG. 7 schematically illustrates a cross-section cut along a line VII-VII of FIG. 1 according to an embodiment.

FIG. 7 is a diagram schematically illustrating a cross-section cut along a line VII-VII of FIG. 1 according to an embodiment, in which an example of the plurality of display panel patterns 30 are illustrated. Referring to FIG. 7, each of the plurality of display panel patterns 30 may include the light emitting element 330 and the plurality of TFTs 320.

The first mother substrate 10 may include the TFTs 320, each of which includes a gate electrode 321, source and drain electrodes 323, an active layer 327, a gate insulating film 313, and an interlayer insulating film 315. The form of the TFT 320 is not limited to this example, and various TFTs may be used such as an organic TFT in which the active layer 327 is provided as an organic material and a silicon TFT in which the active layer 327 is provided as silicon. When necessary, a buffer layer 311 formed of silicon oxide or silicon nitride may be further provided between the TFT 320 and the first mother substrate 10.

The light emitting element 330 may include a first electrode 331, a second electrode 335, and an intermediate layer 333 disposed between the first electrode 331 and the second electrode 335 to at least include a light emitting layer.

The first electrode 331 may function as an anode electrode and the second electrode 335 may function as a cathode electrode. The polarities of the first electrode 331 and the second electrode 335 may be opposite to each other.

The first electrode 331 may be provided as a transparent electrode or a reflective electrode. When being provided as the transparent electrode, the first electrode 331 may be formed of ITO, IZO, ZnO, or $In_2O_3$; when being provided as the reflective electrode, the first electrode 331 may include a reflective film formed of Ag, Mg, Al, Pt, Pd, Au, Ni, Nd, Ir, Cr, or a combination thereof and a film formed of ITO, IZO, ZnO, or $In_2O_3$ on the reflective film.

The second electrode 335 may also be provided as a transparent electrode or a reflective electrode. When being provided as the transparent electrode, the second electrode 335 may include a film in which Li, Ca, LiF/Ca, LiF/Al, Al, Mg, or a combination thereof is deposited to be directed toward the intermediate layer 333 between the first electrode 331 and the second electrode 335 and an auxiliary electrode or a bus electrode line formed of a transparent electrode forming material such as ITO, IZO, ZnO, or $In_2O_3$ on or under the film. When being provided as the reflective electrode, the second electrode 335 may be provided by depositing Li, Ca, LiF/Ca, LiF/Al, Al, Mg, or a combination thereof.

Meanwhile, a pixel defining layer (PDL) 319 is provided to cover an edge of the first electrode 331 and to have a thickness toward outside the first electrode 331. The PDL 319 not only defines a light emitting area, but also widens a gap between the edge of the first electrode 331 and the second electrode 335 to prevent concentration of an electric field in the edge of the first electrode 331 and thus to prevent a short-circuit between the first electrode 331 and the second electrode 335.

The various intermediate layer(s) 333 at least include a light emitting layer between the first electrode 331 and the second electrode 335. The intermediate layer 333 may be formed of a low-molecular organic material or a high-molecular organic material. The light emitting element 330 may be an organic light emitting element.

When the low-molecular organic material is used, a hole injection layer (HIL), a hole transport layer (HTL), an organic emission layer (EML), an electron transport layer (ETL), an electron injection layer (EIL), and the like may be stacked in a single or composite structure, and various organic materials, such as copper phthalocyanine (CuPc), N,N'-Di(naphtha-lene-1-yl)-N, N'-diphenyl-benzidine (NPB), tris-8-hydroxyquinoline aluminum (Alq3), and the like may be used. These low-molecular organic materials may be formed by vacuum deposition using masks.

When the high-molecular organic material is used, the HTL and the EML may be generally provided, in which PEDOT is used for the HTL and a high-molecular organic material such as a poly-phenylenevinylene-based or poly-fluorene-based material is used for the EML.

The organic light emitting element 330 is electrically connected to the TFT 320. When a planarizing film 317 is provided to cover the TFT 320, the organic light emitting element 330 is disposed on the planarizing film 317 and the first electrode 331 of the organic light emitting element 330 is electrically connected to the TFT 320 via a contact hole provided in the planarizing film 317.

The organic light emitting element 330 formed in the first mother substrate 10 is sealed by the second mother substrate 20.

Figure 8:
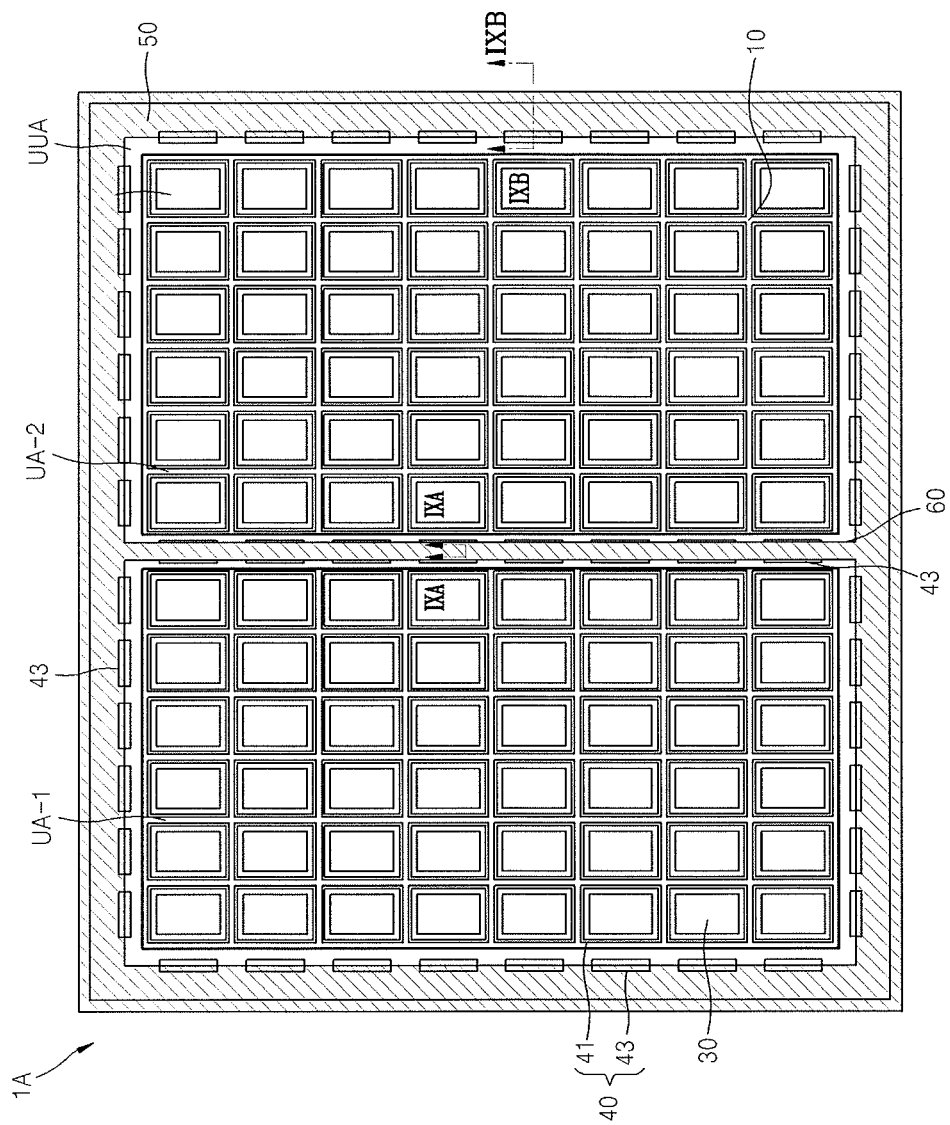
FIG. 8 is a plan view schematically illustrating a mother panel according to another embodiment.
Figure 9A:
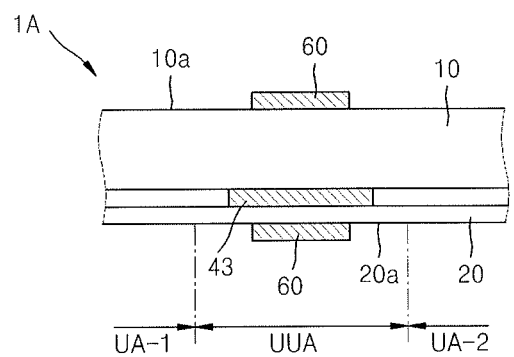
FIG. 9A illustrates a cross-sectional view of FIG. 8 taken along line IXA-IXA of FIG. 8.

FIG. 8 is a plan view schematically illustrating a mother panel 1A according to another embodiment. FIG. 9A illustrates a cross-sectional view of FIG. 8 taken along a line IXA-IXA of FIG. 8, and FIG. 9B illustrates a cross-sectional view of FIG. 8 taken along a line IXB-IXB of FIG. 8.

Figure 9B:
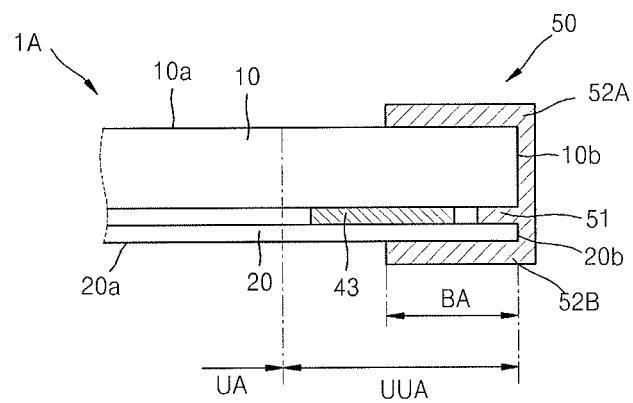
FIG. 9B illustrates a cross-sectional view of FIG. 8 taken along a line IXB-IXB of FIG. 8.

Referring to FIGS. 8 through 9B, a mother panel 1A according to the current embodiment may further include a second etching stopping unit 60. In FIGS. 8 through 9B, the same portions as in the foregoing embodiment are referred to as the same reference numerals and a description thereof will not be repeated.

Referring to FIG. 8, a plurality of usable areas UA-1 and UA-2 may be provided. The plurality of usable areas UA-1 and UA-2 may be disposed spaced apart from each other.

The second etching stopping unit 60 may be disposed between the plurality of usable areas UA-1 and UA-2 on the etching target surfaces 10a and 20a of at least one of the first mother substrate 10 and the second mother substrate 20. By including the second etching stopping unit 60, even if the size of the mother panel 1A increases, the mother panel 1A may be prevented from being bent by a load of the mother panel 1A, such that a crack may be prevented from being generated by a load of the mother panel 1A. When necessary, the dummy sealing member 43 may be disposed under the second etching stopping unit 60 as illustrated in FIG. 8. The second etching stopping unit 60 may be formed of a material which is not etched by the etchant, for example, epoxy based resin. The second etching stopping unit 60 may be formed of the same material as the etching stopping unit 50.

Figure 10A:
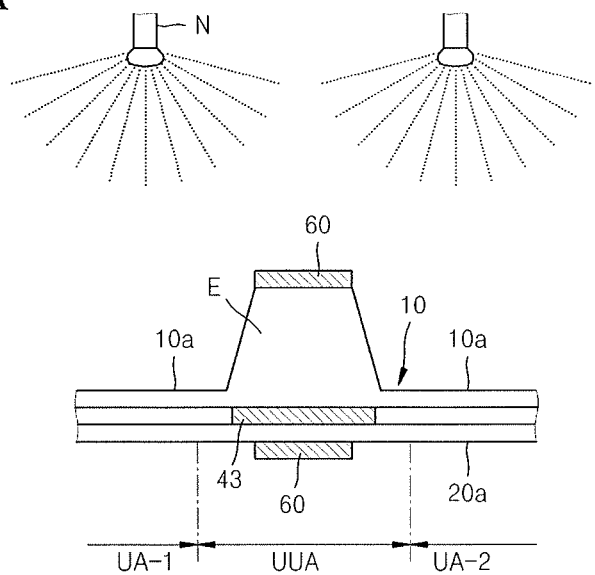
FIGS. 10A and 10B illustrate a state in which etching is performed on a mother panel illustrated in FIGS. 9A and 9B for a predetermined time.
Figure 10B:
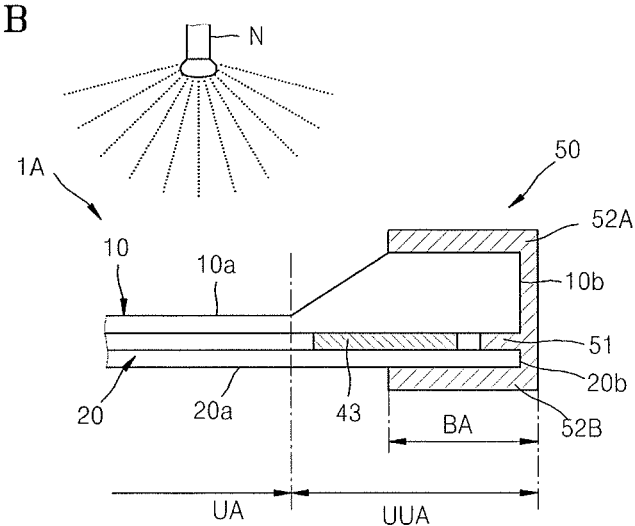

FIGS. 10A and 10B illustrate a state in which etching is performed on the mother panel 1A illustrated in FIGS. 9A and 9B for a predetermined time. As to the second etching stopping unit 60 illustrated in FIG. 10A, even if etching is performed on the etching target surface 10a of the first mother substrate 10, etching does not occur in a portion of the etching target surface 10a which overlaps with the second etching stopping unit 60. Thus, an area having a larger thickness than the usable areas UA-1 and UA-2 (which will be referred to as a support area E) may be formed between the plurality of usable areas UA-1 and UA-2. With the first mother substrate 10 in which the support area E is formed, the load of the mother panel 1A may be supported. Hence, even if the size of the mother panel 1A increases, a crack may be prevented from being generated by the load of the mother panel 1A because the support area E is formed owing to the second etching stopping unit 60. By disposing the second etching stopping unit 60 between the plurality of usable areas UA-1 and UA-2, even if the length of a side of the first mother substrate 10 is larger than about 1500 mm, the first mother substrate 10 may be easily handled, thus improving productivity. The length of a side of the first mother substrate 10 may be smaller than about 2500 mm. Since etching is performed in the same manner as in FIG. 4 in FIG. 10B, it will not be repetitively described.

The second etching stopping unit 60 may have a width of larger than about 2 mm such that the first mother substrate 10 under the second etching stopping unit 60 functions as the support area E. However, considering a gap between the plurality of display panel patterns 30 or a gap between the plurality of usable areas UA-1 and UA-2, the width of the second etching stopping unit 60 may be smaller than about 15 mm.

Figure 11A:
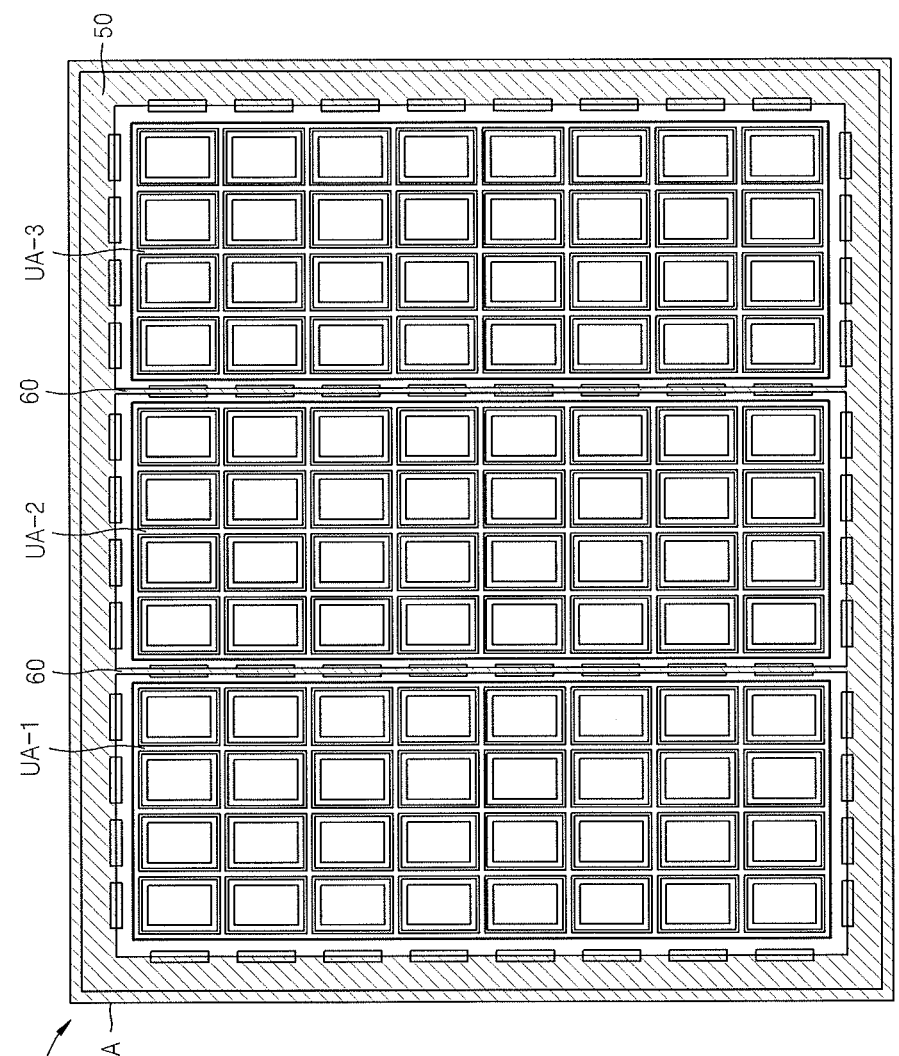
FIGS. 11A, 11B, and 11C are plan views schematically illustrating a mother panel according to another embodiment.
Figure 11B:
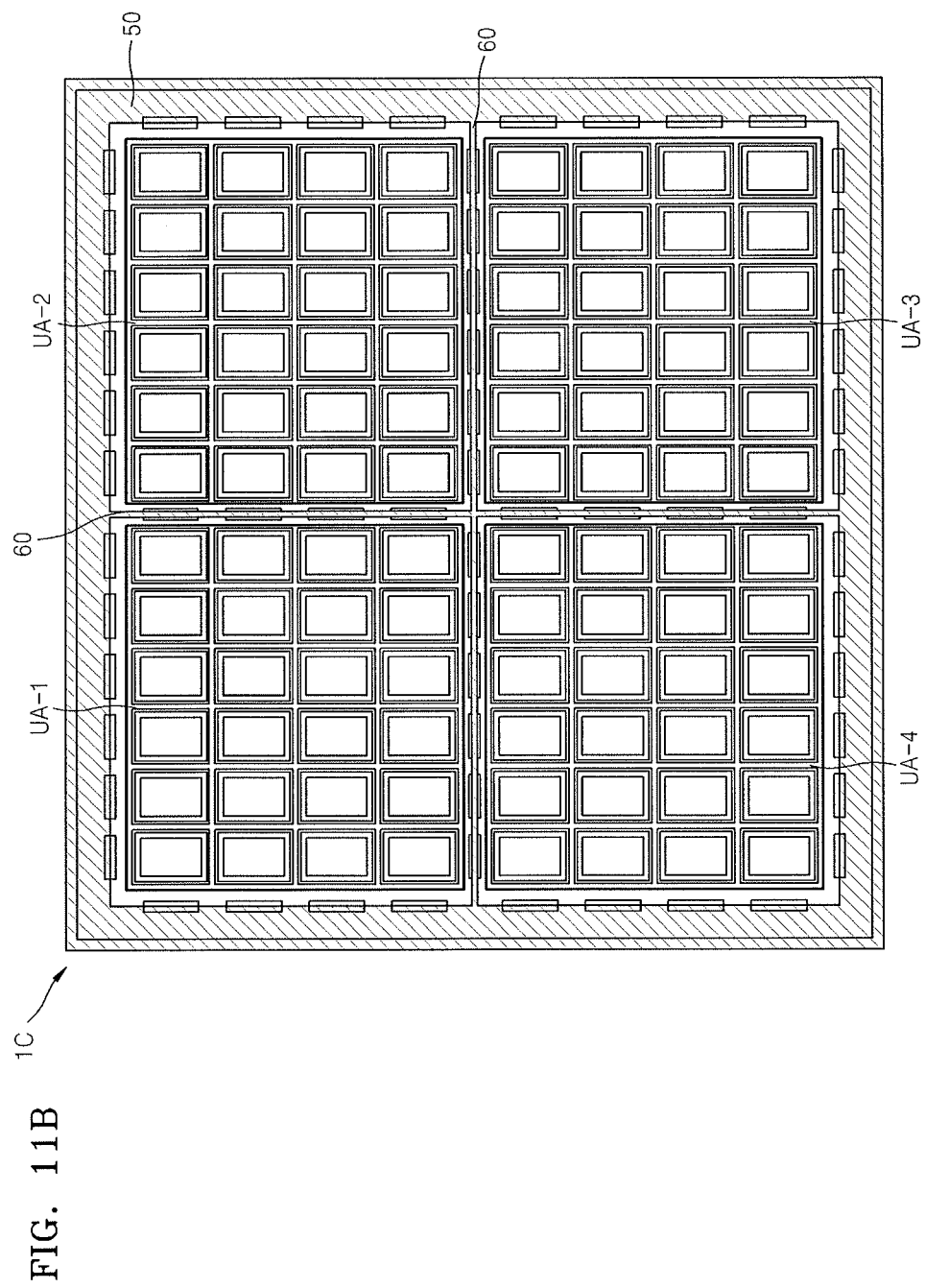
Figure 11C:
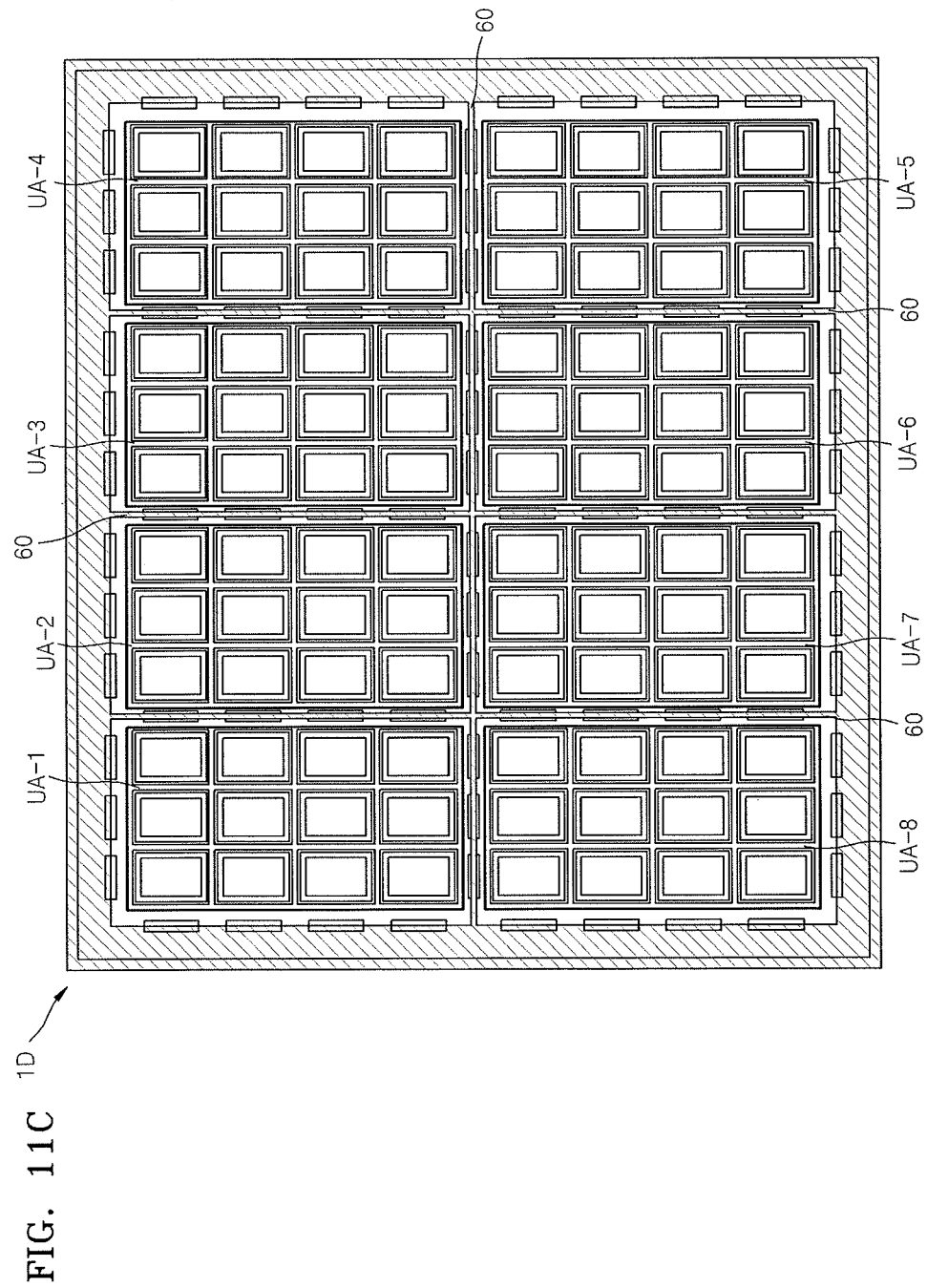

The plurality of usable areas UA may be two usable areas UA-1 and UA-2 as illustrated in FIG. 8, but they may be three or more usable areas UA depending on the size of a mother panel 1B, 1C, or 1D. For example, three usable areas UA-1 through UA-3, four usable areas UA-1 through UA-4, and eight usable areas UA-1 through UA-8 may be provided as illustrated in FIGS. 11A through 11C, respectively. The second etching stopping unit 60 may be disposed between the plurality of usable areas UA-1 and UA-2, UA-1 through UA-3, UA-1 through UA-4, or UA-1 through UA-8.

Next, a description will be made of a method of manufacturing a display panel by using the mother panel 1, 1A, 1B, 1C, or 1D according to the foregoing embodiments.

Figure 12A:
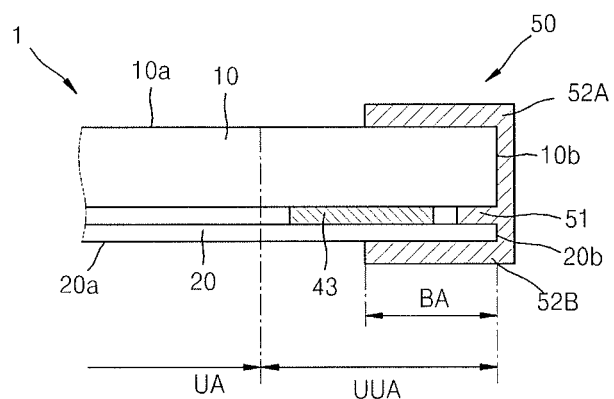
FIGS. 12A, 12B, and 12C schematically illustrate stages in a process of manufacturing a display panel by using the mother panel illustrated in FIG. 1.
Figure 12B:
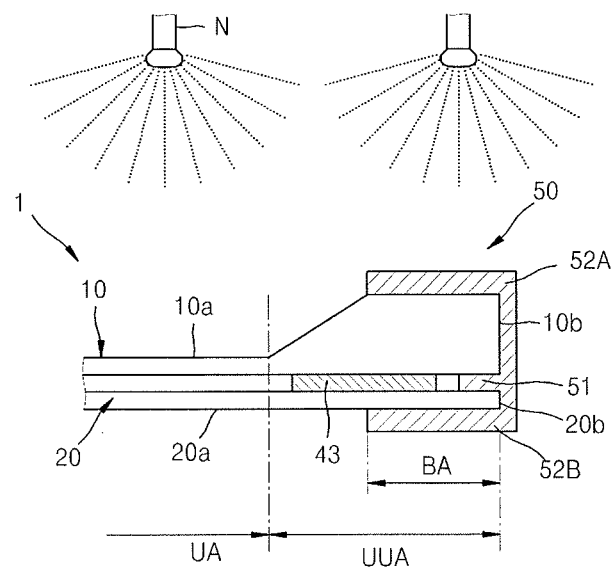
Figure 12C:
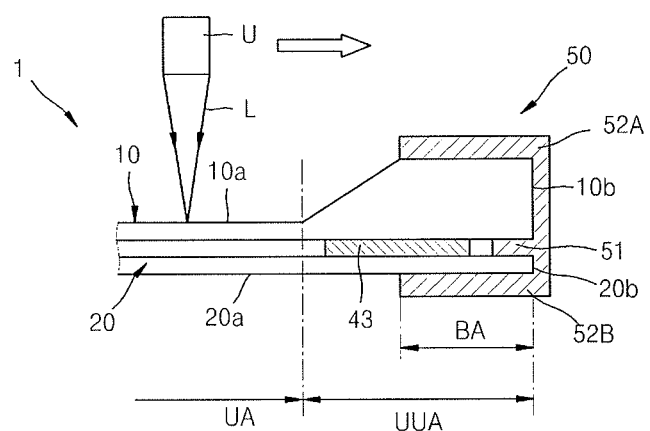

FIGS. 12A through 12C schematically illustrate stages in a process of manufacturing a display panel by using a mother panel illustrated in FIG. 1.

Referring to FIGS. 1 and 12A, the mother panel 1 including the first and second mother substrates 10 and 20 and the plurality of display panel patterns 30 and the seal pattern 40 is provided.

The first and second mother substrates 10 and 20 have the usable area UA and the unusable area UUA, respectively, and the plurality of display panel patterns 30 are disposed between the first mother substrate 10 and the second mother substrate 20 and are disposed spaced apart from each other in the usable area UA. Each seal pattern 40 includes the sealing member 41 which surrounds the display panel pattern 30 and the dummy sealing member 43 formed in the unusable area UUA to reinforce adhesion between the first mother substrate 10 and the second mother substrate 20.

In the mother panel 1, as illustrated in FIG. 2, the etching stopping unit 50 is formed in the boundary area BA between the first mother substrate 10 and the second mother substrate 20 and from the lateral surfaces 10b and 20b of the first and second mother substrates 10 and 20 to the boundary area BA of the etching target surfaces 10a and 20a.

Referring to FIG. 12B, the etchant is sprayed from the etching nozzle N disposed to face the etching target surface 10a of the first mother substrate 10, such that the etching target surface 10a of the first mother substrate 10 is etched. The boundary area BA of the etching target surface 10a is covered with the etching stopping unit 50, such that etching occurs in an area except for the boundary area BA. As a result, the thickness of the boundary area BA which overlaps with the second etching stopping member 52A may be larger than the thickness of the usable area UA. When the second etching stopping unit 60 is further formed between the plurality of usable areas UA-1 and UA-2 as illustrated in FIGS. 10A and 10B, the thickness of an area which overlaps with the second etching stopping unit 60 may be larger than the thicknesses of the usable areas UA-1 and UA-2.

Referring to FIG. 12C, the first mother substrate 10 and the second mother substrate 20 may be cut according to the display panel patterns 30.

As a cutting scheme, e.g., a laser cutting may be used. By using the laser cutting, cutting may be simply performed in spite of different heights in the mother panel 1. More specifically, in a path in which a laser irradiating unit U makes a relative movement in an arrow direction according to the display panel patterns 30, the usable area UA and the unusable area UUA are disposed (e.g., cut). The arrow direction in FIG. 12C is not limiting, the laser may move in one or more suitable directions to cut the first mother substrate 10 and the second mother substrate 20. The unusable area UUA, especially, the boundary area BA in which the second etching stopping member 52A is disposed, and the usable area UA have different heights as illustrated in the drawings. The laser cutting scheme cuts the mother panel 1 by irradiating laser L and does not perform cutting through direct contact friction, such that it may simply perform cutting in spite of height variation. However, a cutting scheme using contact friction, for example, a cutting scheme using a blade may have a problem such that the blade may be worn or may be damaged due to the second etching stopping member 52A having a relatively high height. Although the laser irradiation unit U is illustrated as focusing on the surfaces of the first and second mother substrates 10 and 20, a stealth scheme may also be used in which the inner sides of the first and second mother substrates 10 and 20 are focused.

Although not illustrated in the drawings, a separate breaking process may be performed after cutting to separate the cut display panels.

According to an embodiment, a mother panel which is capable of preventing a damage of a boundary area thereof and is easy to handle during manufacturing may be provided. Moreover, in spite of an increase in the size of the mother panel, a crack is prevented from being generated by a load of the mother panel. A method of manufacturing a display panel using the mother panel may also be provided.

While an organic light emitting display panel has been described as an example of a display panel in the foregoing embodiments, various display panels including a liquid crystal display panel without being limited to the above-described example may be used.

By way of summary and review, when manufacturing a display panel, a mother panel having a size that is several times to several hundreds of times a size of a display panel may be used for improvement of productivity. The mother panel may be cut into respective display panel units, such that complete display panels are manufactured. The display panels may be thin-type display panels which are portable. As one of several methods to manufacture thin-type or slim-type display panels, an etchant may be sprayed over a mother substrate of a mother panel to minimize the thickness. However, in an etching process, etching may be concentrated on an edge portion of a mother substrate, such that the edge portion of the mother substrate becomes thinner than the other portions of the mother substrate. As a result, in a process of transferring or testing the mother panel (or in other processes), a crack may be generated on the edge portion of the mother substrate and even extends toward the center of the mother substrate. Due to the crack, mass productivity of the display panel may be degraded.

The embodiments disclosed herein provide a mother panel for a display panel (e.g., of a thin type) and a method of manufacturing a display panel using the mother panel that may allow a crack to be prevented from being generated on an edge portion of a mother panel. Also, the mother panel may allow a crack to be prevented from being generated due to a load of the mother panel in spite of an increase in the size of the mother panel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A mother panel for a display panel, the mother panel comprising:
    a first mother substrate and a second mother substrate that are spaced apart from each other to face each other, each of the first mother substrate and the second mother substrate including at least one usable area that is usable as the display panel, and at least one unusable area that surrounds the usable area;
    a plurality of display panel patterns between the first mother substrate and the second mother substrate, the plurality of display panel patterns being spaced apart from one another in the usable area;
    a seal pattern that adheres the first mother substrate with the second mother substrate and seals each of the plurality of display panel patterns; and
    an etching stopping unit that prevents an etchant from permeating between the first mother substrate and the second mother substrate and prevents a boundary area of an etching target surface of at least one of the first mother substrate and the second mother substrate from being etched,
    wherein the etching stopping unit includes:
    a first etching stopping member that makes a seal between the first mother substrate and the second mother substrate; and
    a second etching stopping member that covers a lateral surface of at least one of the first mother substrate and the second mother substrate and covers the boundary area of the etching target surface of the at least one of the first mother substrate and the second mother substrate, the etching target surface being at an exterior of the mother panel and being orthogonal to the lateral surface.

2. The mother panel of claim 1, wherein the seal pattern includes:
    a sealing member that surrounds each of the plurality of display panel patterns; and
    a dummy sealing member in the unusable area that increases an adhesive strength between the first mother substrate and the second mother substrate.

3. The mother panel of claim 2, wherein a front of the second etching stopping member is between the lateral surface and a center of the dummy sealing member.

4. The mother panel of claim 1, wherein a length of at least one of the first mother substrate and the second mother substrate is about 730 mm to about 1,500 mm.

5. The mother panel of claim 1, wherein:
    the at least one usable area is a plurality of usable areas,
    the plurality of usable areas are spaced apart from each other, and
    the mother panel further comprises a second etching stopping unit between the plurality of usable areas on the etching target surface of the at least one of the first mother substrate and the second mother substrate.

6. The mother panel of claim 5, wherein a width of the second etching stopping unit is about 2 mm to about 15 mm.

7. The mother panel of claim 5, wherein a length of at least one of the first mother substrate and the second mother substrate is about 1,500 mm to about 2,500 mm.

8. The mother panel of claim 5, wherein the etching stopping unit and the second etching stopping unit are formed of an epoxy-based resin.

9. The mother panel of claim 1, wherein, in at least one of the first mother substrate and the second mother substrate, a thickness of the unusable area is greater than a thickness of the usable area.

10. The mother panel of claim 1, wherein the usable area of at least one of the first mother substrate and the second mother substrate has a thickness of about 0.2 mm or less.

11. The mother panel of claim 1, wherein:
    each of the plurality of display panel patterns includes a first electrode, a second electrode, and an intermediate layer between the first electrode and the second electrode, and
    the intermediate layer includes an organic emission layer.

12. The mother panel of claim 11, wherein:
    each of the plurality of display panel patterns further includes a thin film transistor that is electrically connected with the first electrode, and
    the thin film transistor includes an active layer, a gate electrode, a source electrode, and a drain electrode.

13. A method of manufacturing a display panel, the method comprising:
    providing the mother panel as claimed in claim 1;
    etching the etching target surface of the at least one of the first mother substrate and the second mother substrate; and
    cutting the first mother substrate and the second mother substrate according to the plurality of display panel patterns.

14. The method of claim 13, wherein, in the at least one of the first mother substrate and the second mother substrate that is etched in the etching, a thickness of an area that overlaps the etching stopping unit is larger than a thickness of the usable area.

15. The method of claim 13, wherein:
    the at least one usable area is a plurality of usable areas, and
    forming the etching stopping unit includes forming a second etching stopping unit between the plurality of usable areas on the etching target surface of the at least one of the first mother substrate and the second mother substrate.

16. The method of claim 13, wherein the cutting includes a laser cutting.

17. The method of claim 13, wherein a minimum thickness of the usable area of at least one of the first mother substrate and the second mother substrate is about 0.2 mm or less.

18. The method of claim 13, wherein:
each of the plurality of display panel patterns includes a first electrode, a second electrode, and an intermediate layer between the first electrode and the second electrode, and
the intermediate layer includes an organic emission layer.

19. The method of claim 18, wherein:
each of the plurality of display panel patterns further includes a thin film transistor that is electrically connected with the first electrode, and
the thin film transistor includes an active layer, a gate electrode, a source electrode, and a drain electrode.

20. A mother panel for a display panel, the mother panel comprising:
a first mother substrate and a second mother substrate that are spaced apart from each other to face each other, each of the first mother substrate and the second mother substrate including at least one usable area that is usable as the display panel, and at least one unusable area that surrounds the usable area;
a plurality of display panel patterns between the first mother substrate and the second mother substrate, the plurality of display panel patterns being spaced apart from one another in the usable area;
a seal pattern that adheres the first mother substrate with the second mother substrate and seals each of the plurality of display panel patterns; and
an etching stopping unit that prevents an etchant from permeating between the first mother substrate and the second mother substrate and prevents a boundary area of an etching target surface of at least one of the first mother substrate and the second mother substrate from being etched,
wherein the seal pattern includes:
a sealing member that surrounds each of the plurality of display panel patterns; and
a dummy sealing member in the unusable area that increases an adhesive strength between the first mother substrate and the second mother substrate,
wherein the etching stopping unit includes:
a first etching stopping member that makes a seal between the first mother substrate and the second mother substrate; and
a second etching stopping member that extends from a lateral surface of at least one of the first mother substrate and the second mother substrate to the boundary area of the etching target surface of the at least one of the first mother substrate and the second mother substrate, and
wherein a front of the second etching stopping member is between the lateral surface and a center of the dummy sealing member.

* * * * *